(12) United States Patent
Sakata et al.

(10) Patent No.: US 11,101,415 B2
(45) Date of Patent: Aug. 24, 2021

(54) LIGHT SOURCE APPARATUS AND PROJECTOR

(71) Applicant: SEIKO EPSON CORPORATION, Tokyo (JP)

(72) Inventors: Hidefumi Sakata, Tatsuno-Machi (JP); Junichi Suzuki, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/564,302

(22) Filed: Sep. 9, 2019

(65) Prior Publication Data

US 2020/0083408 A1 Mar. 12, 2020

(30) Foreign Application Priority Data

Sep. 10, 2018 (JP) ............................. JP2018-168784

(51) Int. Cl.
*H01L 33/50* (2010.01)
*H04N 9/31* (2006.01)

(52) U.S. Cl.
CPC ............ *H01L 33/504* (2013.01); *H04N 9/31* (2013.01)

(58) Field of Classification Search
CPC ................................ H01L 33/504; H04N 9/31
See application file for complete search history.

(56) References Cited

U.S. PATENT DOCUMENTS

| 2009/0078949 | A1 | 3/2009 | Bechtel et al. |
| 2009/0196046 | A1* | 8/2009 | Rutherford ............... F21V 9/00 362/296.02 |
| 2014/0022514 | A1 | 1/2014 | Narimatsu et al. |
| 2016/0131813 | A1 | 5/2016 | Hikmet et al. |
| 2016/0266297 | A1 | 9/2016 | Hikmet et al. |
| 2018/0088452 | A1* | 3/2018 | Tajiri ................... H04N 9/3158 |
| 2018/0363858 | A1* | 12/2018 | Peeters .................... G02B 6/00 |
| 2019/0331993 | A1* | 10/2019 | Maeda ................. G03B 21/204 |

FOREIGN PATENT DOCUMENTS

| JP | 2014-021427 A | 2/2014 |
| WO | 2006/054203 A1 | 5/2006 |

* cited by examiner

*Primary Examiner* — Christine A Enad
(74) *Attorney, Agent, or Firm* — Dority & Manning, P.A.

(57) ABSTRACT

A light source apparatus according to an aspect of the present disclosure includes a light source, a first wavelength converter that converts first excitation light into first fluorescence, a second wavelength converter that converts second excitation light into second fluorescence, a third wavelength converter that converts third excitation light into third fluorescence, a light combiner that combines the first fluorescence, the second fluorescence, and the third fluorescence with one another, and a light source driver that causes the light source to output the first excitation light, the second excitation light, and the third excitation light in a time sequential manner. The first, second, and third wavelength converters are disposed in parallel to one another. The excitation light enters the wavelength converters via side surfaces, and the fluorescence exits via end surfaces of the wavelength converters.

20 Claims, 5 Drawing Sheets

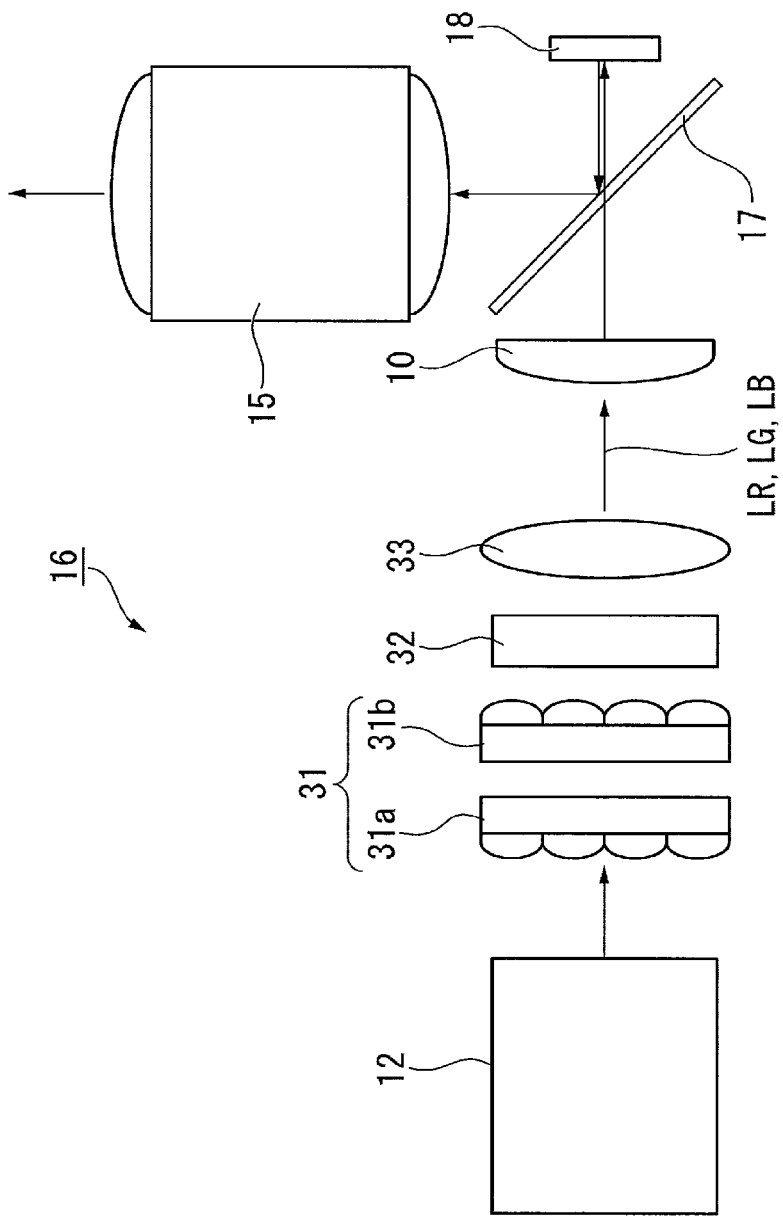

LIGHT SOURCE APPARATUS AND PROJECTOR

The present application is based on, and claims priority from JP Application Serial Number 2018-168784, filed Sep. 10, 2018, the disclosure of which is hereby incorporated by reference herein in its entirety.

BACKGROUND

1. Technical Field

The present disclosure relates to a light source apparatus and a projector.

2. Related Art

There has been a known projector including a light source apparatus driven in a time division color sequential driving method (field sequential method). JP-A-2014-21427 discloses a projector including a first light source that outputs red light, a second light source that outputs green light, a third light source that outputs blue light, and a light path combining element that combines the red light, the green light, and the blue light with one another. In the projector, the first, second, and third light sources are each formed of a light emitting diode, a semiconductor laser, or any other light emitting device and driven in the field sequential method.

In the light source apparatus described in JP-A-2014-21427, the optical path combining element is formed of a dichroic prism, and the first, second, and third light sources are so disposed as to face three surfaces of the dichroic prism. A space for disposing a cooler on a light source basis or routing wires through which power is supplied to the light sources is therefore required, resulting in a problem of an increase in the size of the light source apparatus.

Further, since threshold voltage, drive voltage, and other specifications vary in accordance with the color of the light emitted from each of the light sources, it is necessary to prepare light source drive circuits having specifications different from one another on an emitted light color basis or a common light source drive circuit having an excessive specification that satisfies the specifications of all the light sources. Moreover, since the light sources are disposed in positions separate from one another, long wires that electrically connect the light sources to a drive circuit substrate(s) are required. The long wires have large wiring resistance, which causes signal delay, resulting in a blunt signal waveform in high-speed signal switching, such as pulse width modulation. The display quality therefore undesirably decreases as another problem.

SUMMARY

A light source apparatus according to an aspect of the present disclosure includes a light source that outputs first excitation light, second excitation light, and third excitation light, a first wavelength converter that converts the first excitation light into first fluorescence having a first wavelength band different from a wavelength band of the first excitation light, a second wavelength converter that converts the second excitation light into second fluorescence having a second wavelength band different from a wavelength band of the second excitation light and the first wavelength band, a third wavelength converter that converts the third excitation light into third fluorescence having a third wavelength band different from a wavelength band of the third excitation light and the first wavelength band, a light combiner that combines the first fluorescence, the second fluorescence, and the third fluorescence with one another and outputs combined light, and a light source driver that causes the light source to output the first excitation light, the second excitation light, and the third excitation light in a time sequential manner. The first wavelength converter has a first end surface and a second end surface that face each other and a first side surface that intersects the first and second end surfaces. The second wavelength converter has a third end surface and a fourth end surface that face each other and a second side surface that intersects the third and fourth end surfaces. The third wavelength converter has a fifth end surface and a sixth end surface that face each other and a third side surface that intersects the fifth and sixth end surfaces. The first, second, and third wavelength converters are disposed in parallel to one another. The first excitation light enters the first wavelength converter via the first side surface, the second excitation light enters the second wavelength converter via the second side surface, and the third excitation light enters the third wavelength converter via the third side surface. The first fluorescence exits via the first end surface toward the light combiner, the second fluorescence exits via the third end surface toward the light combiner, and the third fluorescence exits via the fifth end surface toward the light combiner.

In the light source apparatus according to the aspect of the present disclosure, the first wavelength band may be a blue wavelength band, the second wavelength band may be a green wavelength band, and the third wavelength band may be a red wavelength band.

In the light source apparatus according to the aspect of the present disclosure, the first wavelength band may be a blue wavelength band, the second wavelength band may be a yellow wavelength band, and the third wavelength band may be the yellow wavelength band.

In the light source apparatus according to the aspect of the present disclosure, the first wavelength band may be a blue wavelength band, the second wavelength band may be a green wavelength band, and the third wavelength band may be a yellow wavelength band.

In the light source apparatus according to the aspect of the present disclosure, the light source may include a first light emitting device that emits the first excitation light, a second light emitting device that emits the second excitation light, and a third light emitting device that emits the third excitation light, and the first, second, and third light emitting devices may be provided at a substrate that faces the first, second, and third side surfaces.

A projector according to another aspect of the present disclosure includes the light source apparatus according to the aspect of the present disclosure, a light modulator that modulates light from the light source apparatus in accordance with image information, and a projection optical apparatus that projects the light modulated by the light modulator.

BRIEF DESCRIPTION OF THE DRAWINGS

FIG. 5 is a schematic configuration diagram of a projector according to a second embodiment.

DESCRIPTION OF EXEMPLARY EMBODIMENTS

First Embodiment

A first embodiment of the present disclosure will be described below with reference to FIGS. 1 to 3.

A projector according to the present embodiment is an example of a projector including a micromirror-type light modulator.

Figure 1:
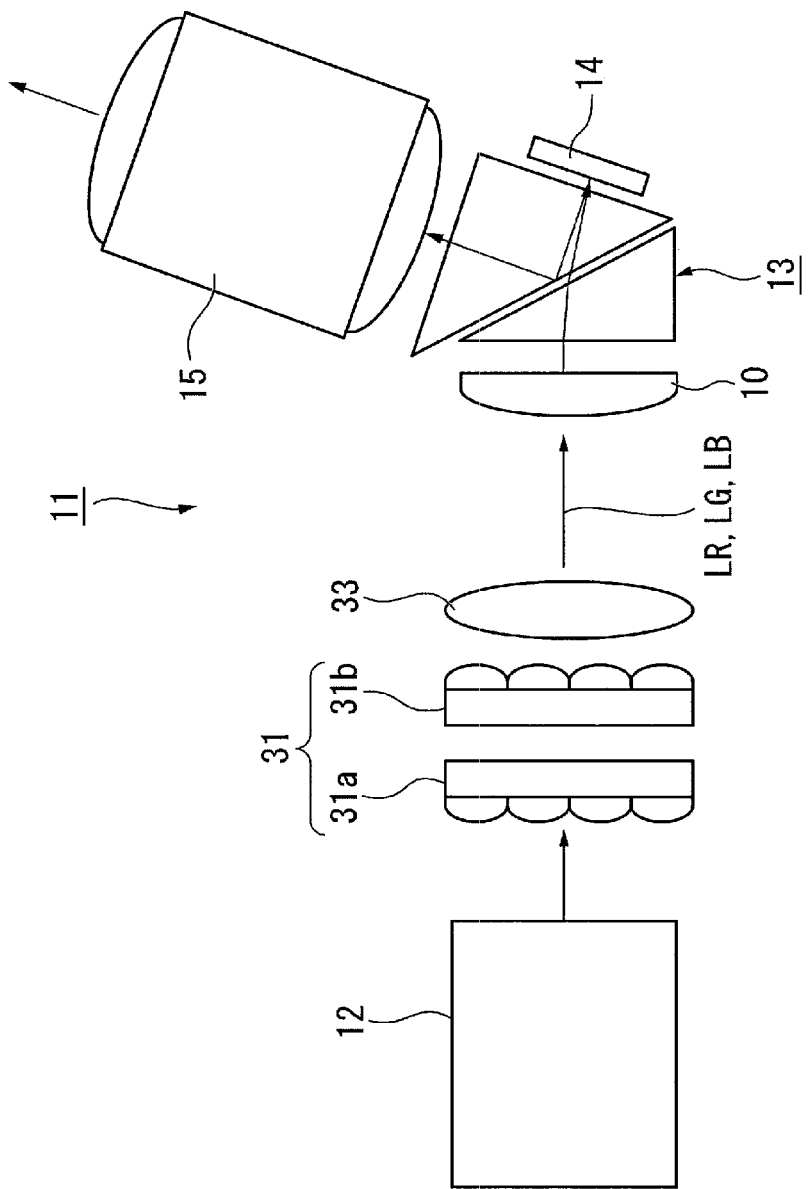
FIG. 1 is a schematic configuration diagram of a projector according to a first embodiment.

FIG. 1 is a schematic configuration diagram of the projector according to the first embodiment.

In the following drawings, components are drawn at different dimensional scales in some cases for clarity of each of the components.

A projector 11 according to the present embodiment includes a light source apparatus 12, an optical integration system 31, a superimposing system 33, a field lens 10, a light guide system 13, a micromirror-type light modulator 14, and a projection optical apparatus 15, as shown in FIG. 1.

In the present embodiment, the light source apparatus 12 is based on a color sequential drive method for outputting blue light, green light, and red light a time division manner. A detailed configuration of the light source apparatus 12 will be described later.

The optical integration system 31 and the superimposing system 33 form a uniform illumination system. The optical integration system 31 includes a first lens array 31a and a second lens array 31b. The superimposing system 33 is formed of a convex lens. The uniform illumination system homogenizes the intensity distribution of illumination light outputted from the light source apparatus 12 on the light modulator 14, which is a region to be illuminated. The illumination light having exited out of the superimposing system 33 enters the field lens 10.

The field lens 10 parallelizes the chief ray of the light having exited out of the superimposing system 33. The field lens 10 is formed of a convex lens.

The light guide system 13 is formed of an internal total reflection prism (TIR prism). The light guide system 13 sequentially transmits red light LR, green light LG, and blue light LB outputted from the light source apparatus 12, causes them to be incident on the light modulator 14 in a time division manner, and causes image light outputted from the light modulator 14 to be totally reflected off the TIR prism to guide the image light to the projection optical apparatus 15.

For example, a digital micromirror device (DMD) is used as the micromirror-type light modulator 14. A DMD has a configuration in which a plurality of micromirrors are arranged in a matrix. A DMD switches the inclination direction of the plurality of micromirrors from one direction to another to switch the direction in which light incident on the DMD is reflected between the direction in which the light enters the projection optical apparatus 15 and the direction in which the light does not enter the projection optical apparatus 15 at highspeed. The light modulator 14 thus modulates the red light LR, the green light LG, and the blue light LB outputted from the light source apparatus 12 in accordance with the light emission timings of the red light LR, the green light LG, and the blue light LB to sequentially produce a green image, a red image, and a blue image.

The projection optical apparatus 15 projects the green image, the red image, and the blue image on a screen. The projection optical apparatus 15 is formed, for example, of a plurality of projection lenses.

The light source apparatus 12 will be described below.

Figure 2:
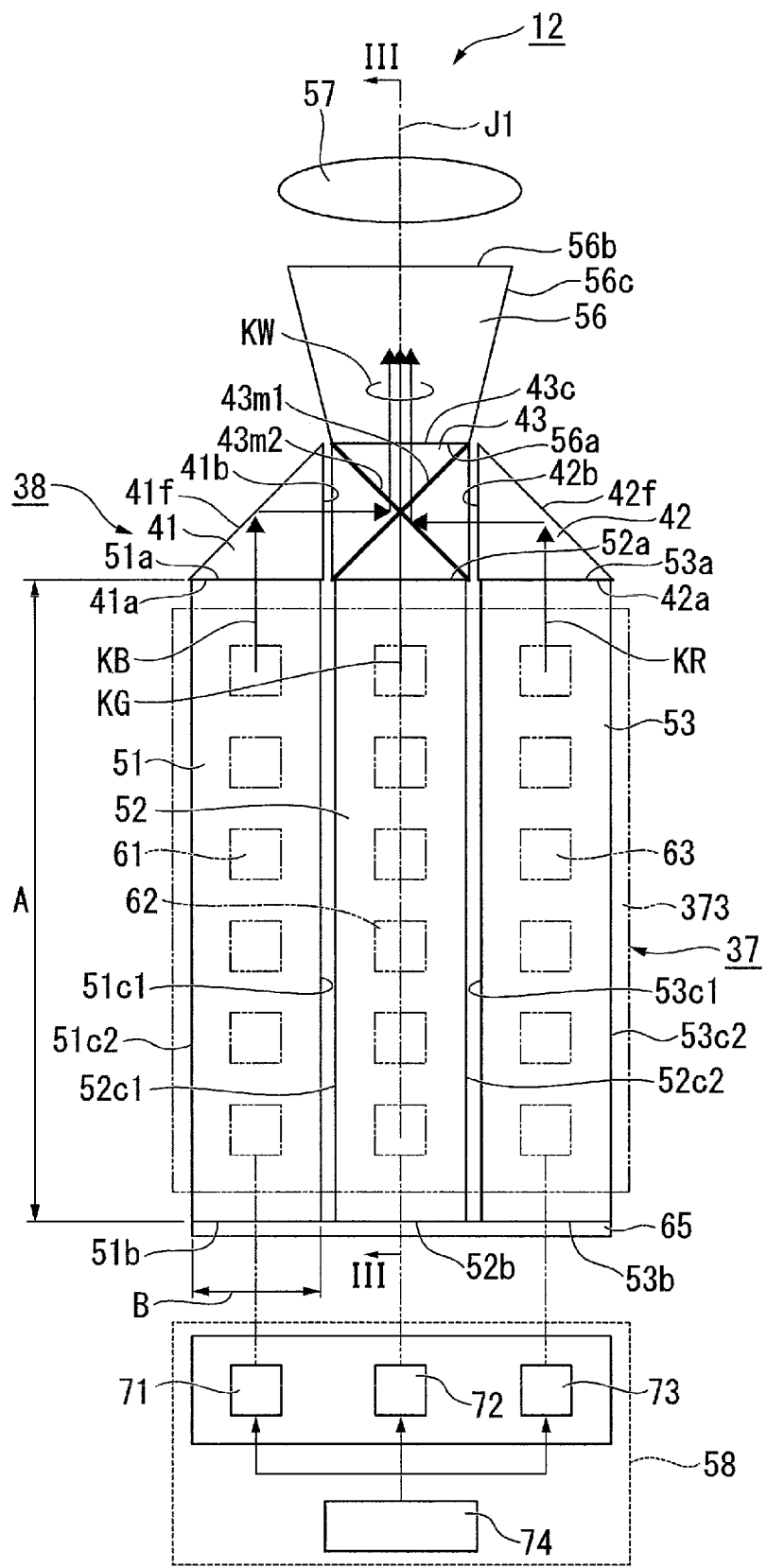
FIG. 2 is a schematic configuration diagram of a light source apparatus in the first embodiment.

FIG. 2 is a schematic configuration diagram of the light source apparatus 12. FIG. 3 is a cross-sectional view of the light source apparatus 12 taken along the line III-III in FIG. 2.

The light source apparatus 12 includes a first wavelength conversion rod 51 (first wavelength converter), a second wavelength conversion rod 52 (second wavelength converter), a third wavelength conversion rod 53 (third wavelength converter), light sources 37, a light combiner 38, an angle conversion element 56, a collimator lens 57, and a light source driver 58, as shown in FIG. 2.

Figure 3:
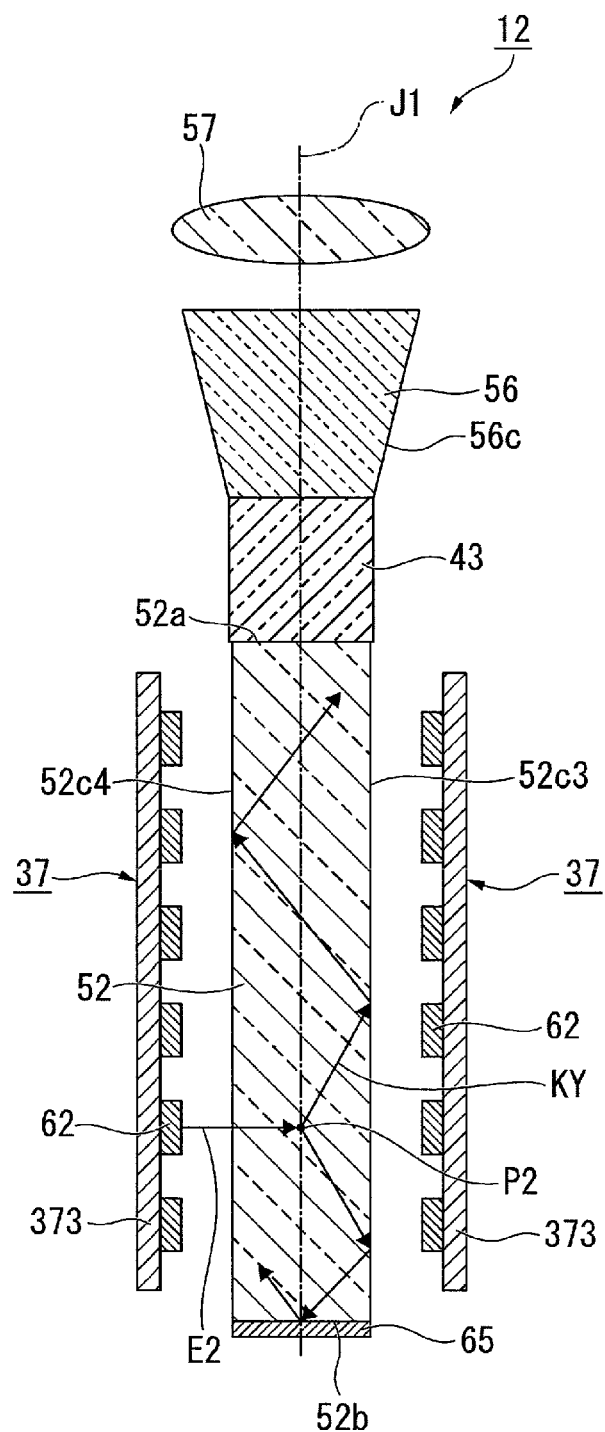
FIG. 3 is a cross-sectional view of the light source apparatus taken along the line in FIG. 2.

The first wavelength conversion rod 51 has a quadrangular columnar shape and has a first end surface 51a and a second end surface 51b, which face each other, and four side surfaces 51c1 and 51c2, which intersect the first end surface 51a and the second end surface 51b, as shown in FIGS. 2 and 3. The side surfaces formed of the four side surfaces 51c1 and 51c2 as a whole correspond to the first side surface in the appended claims. Out of the four side surfaces, only the two side surfaces 51c1 and 51c2 are labeled with reference characters for clarity of the drawings.

The second wavelength conversion rod 52 has a quadrangular columnar shape and has a third end surface 52a and a fourth end surface 52b, which face each other, and four side surfaces 52c1 and 52c2, which intersect the third end surface 52a and the fourth end surface 52b. The side surfaces formed of the four side surfaces 52c1 and 52c2 as a whole correspond to the second side surface in the appended claims. Out of the four side surfaces, only the two side surfaces 52c1 and 52c2 are labeled with reference characters for clarity of the drawings. An axis passing through the center of the third end surface 52a of the second wavelength conversion rod 52 and the center of the fourth end surface 52b thereof is defined as an optical axis J1 of the light source apparatus 12. The light from the light source apparatus 12 is outputted along the optical axis J1.

The third wavelength conversion rod 53 has a quadrangular columnar shape and has a fifth end surface 53a and a sixth end surface 53b, which face each other, and four side surfaces, which intersect the fifth end surface 53a and the sixth end surface 53b. The side surfaces formed of the four side surfaces as a whole correspond to the third side surface in the appended claims. Out of the four side surfaces, only the two side surfaces 53c1 and 53c2 are labeled with reference characters for clarity of the drawings.

In the present embodiment, the first wavelength conversion rod 51, the second wavelength conversion rod 52, and the third wavelength conversion rod 53 have substantially the same dimensions. A length A of the first wavelength conversion rod 51 in the longitudinal direction thereof (direction of normal to first end surface 51a) is greater than a length B of the first wavelength conversion rod 51 in the width direction thereof (direction of normal to side surface 51c1). For example, the length A is greater than the length B by a factor of about ten to several dozens. The second wavelength conversion rod 52 and the third wavelength conversion rod 53 are configured in the same manner as is the first wavelength conversion rod 51.

The first wavelength conversion rod 51, the second wavelength conversion rod 52, and the third wavelength conversion rod 53 may not each necessarily have a quadrangular columnar shape and may instead have a triangular or any other polygonal columnar shape. The first wavelength conversion rod 51, the second wavelength conversion rod 52, and the third wavelength conversion rod 53 may each still instead have a cylindrical shape. In the case where the wavelength conversion rods each have a cylindrical shape, the wavelength conversion rod has two end surfaces facing each other and one side surface that intersects the two end surfaces.

The first wavelength conversion rod 51 and the second wavelength conversion rod 52 are so disposed with a gap therebetween that the side surface 51c1 of the first wavelength conversion rod 51 faces the side surface 52c1 of the second wavelength conversion rod 52. That is, the side surface 51c1 of the first wavelength conversion rod 51 faces the side surface 52c1 of the second wavelength conversion rod 52 via an air layer.

The second wavelength conversion rod 52 and the third wavelength conversion rod 53 are so disposed with a gap therebetween that the side surface 52c2 of the second wavelength conversion rod 52 faces the side surface 53c1 of the third wavelength conversion rod 53. That is, the side surface 52c2 of the second wavelength conversion rod 52 faces the side surface 53c1 of the third wavelength conversion rod 53 via an air layer. That is, the first wavelength conversion rod 51, the second wavelength conversion rod 52, and the third wavelength conversion rod 53 are disposed in parallel to one another.

The air layer between the side surface 51c1 of the first wavelength conversion rod 51 and the side surface 52c1 of the second wavelength conversion rod 52 may be replaced, for example, with a transmissive member made, for example, of glass. In the case where an air layer is provided between the two wavelength conversion rods 51 and 52, fluorescence KB and KG that exit out of the wavelength conversion rods 51 and 52 are readily caused to have a uniform angular distribution, the second fluorescence KG from the second wavelength conversion rod 52, which is the center wavelength conversion rod out of the three wavelength conversion rods, propagates with high efficiency, and other effects are provided. In the case where a transmissive member is provided between the two wavelength conversion rods 51 and 52, the first fluorescence KB is extracted via the first end surface 51a of the first wavelength conversion rod 51, which is an outer wavelength conversion rod out of the three wavelength conversion rods, by an increased amount. From the same reason, the air layer between the side surface 52c2 of the second wavelength conversion rod 52 and the side surface 53c1 of the third wavelength conversion rod 53 may be replaced, for example, with a transmissive member made, for example, of glass.

In the following description, an end surface of the first wavelength conversion rod 51 that is the end surface via which light exits is called the first end surface 51a, and an end surface of the first wavelength conversion rod 51 that is the end surface facing away from the first end surface 51a is called the second end surface 51b. An end surface of the second wavelength conversion rod 52 that is the end surface via which light exits is called the third end surface 52a, and an end surface of the second wavelength conversion rod 52 that is the end surface facing away from the third end surface 52a is called the fourth end surface 52b. An end surface of the third wavelength conversion rod 53 that is the end surface via which light exits is called the fifth end surface 53a, and an end surface of the third wavelength conversion rod 53 that is the end surface facing away from the fifth end surface 53a is called the sixth end surface 53b.

The light sources 37 include a plurality of light emitting diodes 61, 62, and 63 (LEDs) and substrates 373, on which the plurality of LEDs 61, 62, and 63 are mounted. In the present embodiment, the light sources 37 each include 18 LEDs 61, 62, and 63 arranged in 3 rows each formed of 6 LEDs, but the number of LEDs is not limited to a specific number. Specifically, the light sources 37 include the first LEDs 61 (first light emitting device), which each emit first excitation light, the second LEDs 62 (second light emitting device), which each emit second excitation light, the third LEDs 63 (third light emitting device), which each emit third excitation light, and the substrates 373, which are so provided as to face side surfaces of the wavelength conversion rods 51, 52, and 53.

The first LEDs 61 are so provided as to face side surfaces of the first wavelength conversion rod 51 and emit the first excitation light toward the side surfaces of the first wavelength conversion rod 51. The second LEDs 62 are so provided as to face side surfaces of the second wavelength conversion rod 52 and emit the second excitation light toward the side surfaces of the second wavelength conversion rod 52. The third LEDs 63 are so provided as to face side surfaces of the third wavelength conversion rod 53 and emit the third excitation light toward the side surfaces of the third wavelength conversion rod 53. Therefore, the first excitation light enters the first wavelength conversion rod 51 via the side surfaces thereof, the second excitation light enters the second wavelength conversion rod 52 via the side surfaces thereof, and the third excitation light enters the third wavelength conversion rod 53 via the side surfaces thereof.

The light sources 37 are so provided as to face two out of the four side surfaces of the second wavelength conversion rod 52, side surfaces 52c3 and 52c4, which are parallel to the direction in which three wavelength conversion rods 51, 52, and 53 are arranged (direction perpendicular to plane of view), as shown in FIG. 3. The light sources 37 so provided as to face the two side surfaces 52c3 and 52c4 have the same configuration.

The first LEDs 61, the second LEDs 62, and the third LEDs 63 may each be an LED that emits excitation light having, for example, an ultraviolet wavelength band from about 200 to 395 nm. Instead, the first LEDs 61 may each be an LED that emits excitation light having, for example, the ultraviolet wavelength band from about 200 to 395 nm, and the second LEDs 62 and the third LEDs 63 may each be an LED that emits excitation light having, for example, a violet wavelength band from about 400 to 435 nm or a blue wavelength band from about 435 to 495 nm. The light sources 37 may each further include a light guide, a diffuser, a lens, and other optical members as well as the substrate 373 and the LEDs 61, 62, and 63.

The first wavelength conversion rod 51 converts the first excitation light into the first fluorescence KB (blue light LB) having a first wavelength band. The first wavelength band is, for example, a blue wavelength band ranging from 450 to 495 nm. The first wavelength conversion rod 51 is, for example, made of fluorescent glass that is glass in which a rare earth ion is dispersed or formed of a binder which is made, for example, of glass or resin and in which a blue phosphor is dispersed. Specifically, the fluorescent glass is, for example, LUMILASS (product name, manufactured by SUMITA OPTICAL GLASS, Inc.). The blue phosphor is, for example, $BaMgAl_{10}O_{17}$:Eu(II). The first fluorescence KB exits via the first end surface 51a of the first wavelength conversion rod 51 toward the light combiner 38.

The second wavelength conversion rod 52 converts the second excitation light into the second fluorescence KG (green light LG) having a second wavelength band. The second wavelength band is, for example, a green wavelength band ranging from 500 to 575 nm. The second wavelength conversion rod 52 contains, as a green phosphor, for example, an $Lu_3Al_5O_{12}:Ce^{3+}$-based phosphor, a $Y_3O_4:Eu^{2+}$-based phosphor, a $(Ba, Sr)_2SiO_4:Eu^{2+}$-based phosphor, $Ba_3Si_6O_{12}N_2:Eu^{2+}$-based phosphor, an $(Si,Al)_6(O,N)_8:Eu^{2+}$-based phosphor, or any other phosphor material. The second fluorescence KG exits via the third end surface 52*a* of the second wavelength conversion rod 52 toward the light combiner 38.

The third wavelength conversion rod 53 converts the third excitation light into the third fluorescence KR (red light LR) having a third wavelength band. The third wavelength band is, for example, a red wavelength band ranging from 600 to 800 nm. The third wavelength conversion rod 53 contains, as a red phosphor, a YAG-based phosphor made, for example, of $(Y_{1-x}Gd_x)_3(Al,Ga)_5O_{12}$ in which any of Pr, Eu, and Cr is dispersed as an activator (any of Pr:YAG, Eu:YAG, and Cr:YAG). The activator may be one type selected from Pr, Eu, and Cr or may be a co-activator containing a plurality of types selected from Pr, Eu, and Cr. The third fluorescence KR exits via the fifth end surface 53*a* of the third wavelength conversion rod 53 toward the light combiner 38.

The first wavelength conversion rod 51 includes a mirror 65, which is provided on the second end surface 51*b* of the first wavelength conversion rod 51. The second wavelength conversion rod 52 includes a mirror 65, which is provided on the fourth end surface 52*b* of the second wavelength conversion rod 52. The third wavelength conversion rod 53 includes a mirror 65, which is provided on the sixth end surface 53*b* of the third wavelength conversion rod 53. In the present embodiment, the first wavelength conversion rod 51, the second wavelength conversion rod 52, and the third wavelength conversion rod 53 are provided with the single common mirror 65. Instead, the mirror 65 may be provided on a wavelength conversion rod basis. The mirror 65 is formed of a metal film or a dielectric multilayer film formed on one end surface of each of the wavelength conversion rods 51, 52, and 53.

The light combiner 38 includes a first prism 41, a second prism 42, and a dichroic prism 43. The light combiner 38 combines the first fluorescence KB, the second fluorescence KG, and third fluorescence KR with one another and outputs combined light KW.

The first prism 41 is formed of a triangular columnar prism having a right-angled isosceles triangular cross section. The first prism 41 has a light incident end surface 41*a*, a reflection surface 41*f*, and a light exiting end surface 41*b*. The first prism 41 deflects the optical path of the first fluorescence KB incident thereon by 90° and causes the first fluorescence KB to exit along the deflected optical path.

The second prism 42 is formed of a triangular columnar prism having a right-angled isosceles triangular cross section, as is the first prism 41. The second prism 42 has a light incident end surface 42*a*, a reflection surface 42*f*, and a light exiting end surface 42*b*. The second prism 42 deflects the optical path of the third fluorescence KR incident thereon by 90° and causes the third fluorescence KR to exit along the deflected optical path. The first prism 41 and the second prism 42 can each be replaced with a reflector having the same function in the present embodiment.

The first prism 41 is provided on the first end surface 51*a* of the first wavelength conversion rod 51. The first fluorescence KB (blue light) having exited via the first end surface 51*a* of the first wavelength conversion rod 51 is reflected off the reflection surface 41*f*, which deflects the optical path of the first fluorescence KB by 90°, and the first fluorescence KB exits via the light exiting end surface 41*b*.

The second prism 42 is provided on the fifth end surface 53*a* of the third wavelength conversion rod 53. The third fluorescence KR (red light) having exited via the fifth end surface 53*a* of the third wavelength conversion rod 53 is reflected off the reflection surface 42*f*, which deflects the optical path of the third fluorescence KR by 90°, and the third fluorescence KR exits via the light exiting end surface 42*b*.

The dichroic prism 43 is so provided as to face the light exiting end surface 41*b* of the first prism 41, the light exiting end surface 42*b* of the second prism 42, and the third end surface 52*a* of the second wavelength conversion rod 52. The dichroic prism 43 includes a first dichroic mirror 43*m*1 and a second dichroic mirror 43*m*2, which intersect each other. The first dichroic mirror 43*m*1 reflects the first fluorescence KB (blue light) and transmits the second fluorescence KG (green light) and the third fluorescence KR (red light). The second dichroic mirror 43*m*2 reflects the third fluorescence KR (red light) and transmits the first fluorescence KB (blue light) and the second fluorescence KG (green light). The dichroic prism 43 thus combines the first fluorescence KB having exited out of the first wavelength conversion rod 51, the second fluorescence KG having exited out of the second wavelength conversion rod 52, and the third fluorescence KR having exited out of the third wavelength conversion rod 53 with one another and outputs the combined light KW.

The angle conversion element 56 is provided on the light exiting side of a light exiting end surface 43*c* of the dichroic prism 43. The angle conversion element 56 is formed of a tapered rod having a light incident end surface 56*a*, on which the combined light KW is incident, a light exiting end surface 56*b*, via which the combined light KW exits, and a side surface 56*c*, which interests the light incident end surface 56*a* and the light exiting end surface 56*b*. The angle conversion element 56 has a truncated pyramidal shape, with the cross-sectional area thereof perpendicular to the optical axis J1 increasing with distance along the traveling direction of the combined light KW, and the area of the light exiting end surface 56*b* is therefore greater than the area of the light incident end surface 56*a*. The thus shaped angle conversion element 56 angularly changes the traveling direction of the combined light KW, while the combined light KW travels in the angle conversion element 56, to the direction parallel to the optical axis J1 each time the combined light KW is totally reflected off the side surface 56*c*. The angle conversion element 56 thus causes the diffusion angle of the combined light KW at the light exiting end surface 56*b* to be smaller than the diffusion angle of the combined light KW at the light incident end surface 56*a*.

The angle conversion element 56 is so fixed to the dichroic prism 43 that the light incident end surface 56*a* faces the light exiting end surface 43*c* of the dichroic prism 43. That is, the angle conversion element 56 and the dichroic prism 43 are in contact with each other via an optical adhesive (not shown), and no air gap (air layer) is provided between the angle conversion element 56 and the dichroic prism 43. The angle conversion element 56 may instead be so fixed to the dichroic prism 43, for example, via an arbitrary support member that the three components are in direct contact with one another. In either case, it is desirable that no air gap is provided between the angle conversion element 56 and the dichroic prism 43. It is further desirable that the refractive index of the angle conversion element 56 is as close as possible to the refractive index of the dichroic prism 43.

The angle conversion element 56 may be a compound parabolic concentrator (CPC) in place of the tapered rod. In the case where the angle conversion element 56 is a CPC, the same effect as that when the angle conversion element 56 is the tapered rod is provided.

The collimator lens 57 is provided on the light exiting side of the light exiting end surface 56b of the angle conversion element 56. The collimator lens 57 parallelizes the combined light KW having exited out of the angle conversion element 56. That is, the collimator lens 57 further increases the parallelism of the combined light KW, the angular distribution of which has been converted by the angle conversion element 56. The collimator lens 57 is formed of a convex lens. In a case where only the angle conversion element 56 provides sufficient parallelism of the combined light KW, the collimator lens 57 may not be provided.

The light source driver 58 includes a first LED driver 71, a second LED driver 72, a third LED driver 73, and a controller 74. The first LED driver 71 supplies current that turns on the first LEDs 61. The second LED driver 72 supplies current that turns on the second LEDs 62. The third LED driver 73 supplies current that turns on the third LEDs 63. In accordance with the timings of the color image signals supplied to the light modulator 14, the controller 74 supplies the corresponding LED drivers 71, 72, and 73 with drive signals to turn on and off the LEDs 61, 62, and 63.

In the light source driver 58, the LED drivers 71, 72, and 73 sequentially supply the current to the LEDs 61, 62, and 63 in accordance with the drive signals from the controller 74, and the LEDs 61, 62, and 63 sequentially emit the excitation light. That is, the light source driver 58 causes the LEDs 61, 62, and 63 to output the first excitation light, the second excitation light, and the third excitation light in a time sequential manner. As a result, the first fluorescence KB (blue light) exits out of the first wavelength conversion rod 51 for the period for which the first LEDs 61 emit the first excitation light, the second fluorescence KG (green light) exits out of the second wavelength conversion rod 52 for the period for which the second LEDs 62 emit the second excitation light, and the third fluorescence KR (red light) exits out of the third wavelength conversion rod 53 for the period for which the third LEDs 63 emit the third excitation light.

Figure 4:
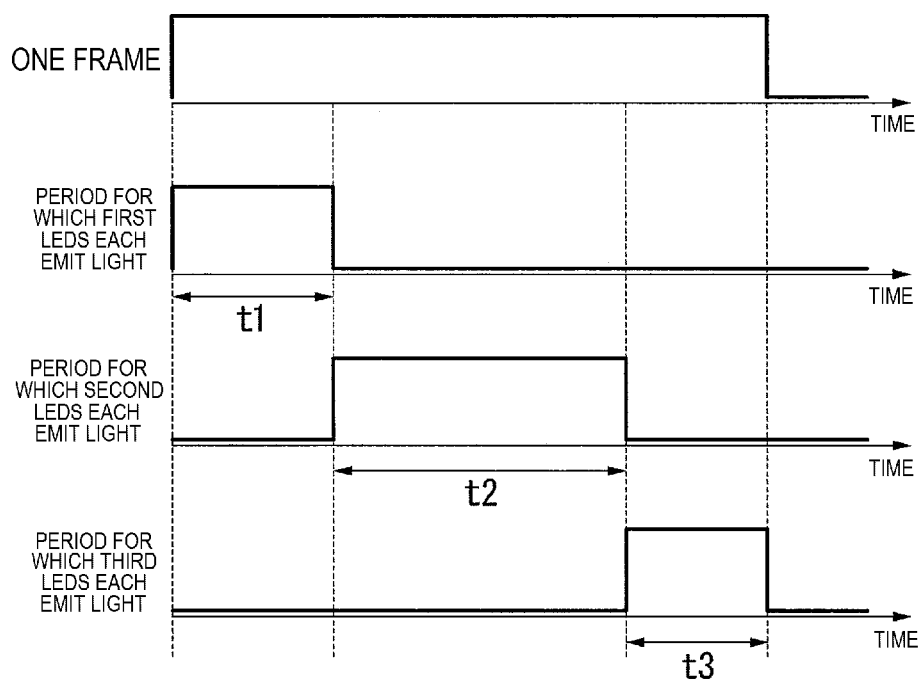
FIG. 4 is a timing chart of drive signals supplied to LEDs.

FIG. 4 shows an example of the timing chart of the drive signals supplied to the LEDs 61, 62, and 63.

In FIG. 4, the uppermost waveform shows one-frame period of the light modulator 14, and the one-frame period is divided into three periods: the period for which the first LEDs 61 each emit light; the period for which the second LEDs 62 each emit light; and the period for which the third LEDs 63 each emit light. The periods for which the LEDs 61, 62, and 63 emit light differ from one another. Let t1 be the period for which the first LEDs 61 each emit light, t2 be the period for which the second LEDs 62 each emit light, and t3 be the period for which the third LEDs 63 each emit light, and the ratio among the light emission periods is t1:t2:t3=1:7:2 as an example. The ratio among the light emission periods allows generation of white combined light KW.

The behavior of the light in the light source apparatus 12 having the configuration described above will be described below.

When the first excitation light emitted from the first LEDs 61 enters the first wavelength conversion rod 51 in the period for which the first LEDs emit light, the first excitation light excites the blue phosphor contained in the first wavelength conversion rod 51, and the blue phosphor emits the first fluorescence KB (blue light). The first fluorescence KB travels toward the first end surface 51a or the second end surface 51b while being reflected off the side surfaces. The first fluorescence KB traveling toward the first end surface 51a enters the first prism 41. On the other hand, the first fluorescence KB traveling toward the second end surface 51b is reflected off the mirror 65, which deflects back the optical path of the first fluorescence KB, and the reflected first fluorescence KB travels toward the first end surface 51a.

The first fluorescence KB having exited out of the first wavelength conversion rod 51 is reflected off the reflection surface 41f of the first prism 41, which deflects the optical path of the first fluorescence KB, and the reflected first fluorescence KB enters the dichroic prism 43. The first fluorescence KB is reflected off the first dichroic mirror 43m1, exits out of the dichroic prism 43, and enters the angle conversion element 56.

When the second excitation light emitted from the second LEDs 62 enters the second wavelength conversion rod 52 in the period for which the second LEDs emit light, the second excitation light excites the green phosphor contained in the second wavelength conversion rod 52, and the green phosphor emits the second fluorescence KG (green light). The second fluorescence KG travels toward the third end surface 52a or the fourth end surface 52b while being reflected off the side surfaces. The second fluorescence KG traveling toward the third end surface 52a enters the dichroic prism 43. On the other hand, the second fluorescence KG traveling toward the fourth end surface 52b is reflected off the mirror 65, which deflects back the optical path of the second fluorescence KG, and the reflected second fluorescence KG travels toward the third end surface 52a.

The second fluorescence KG having exited out of the second wavelength conversion rod 52 passes through the two dichroic mirrors 43m1 and 43m2, exits out of the dichroic prism 43, and enters the angle conversion element 56.

When the third excitation light emitted from the third LEDs 63 enters the third wavelength conversion rod 53 in the period for which the third LEDs emit light, the third excitation light excites the red phosphor contained in the third wavelength conversion rod 53, and the red phosphor emits the third fluorescence KR (red light). The third fluorescence KR travels toward the fifth end surface 53a or the sixth end surface 53b while being reflected off the side surfaces. The third fluorescence KR traveling toward the fifth end surface 53a enters the second prism 42. On the other hand, the third fluorescence KR traveling toward the sixth end surface 53b is reflected off the mirror 65, which deflects back the optical path of the third fluorescence KR, and the reflected third fluorescence KR travels toward the fifth end surface 53a.

The third fluorescence KR having exited out of the third wavelength conversion rod 53 is reflected off the reflection surface 42f of the second prism 42, which deflects the optical path of the third fluorescence KR, and the reflected third fluorescence KR enters the dichroic prism 43. The third fluorescence KR is reflected off the second dichroic mirror 43m2, exits out of the dichroic prism 43, and enters the angle conversion element 56.

As described above, the fluorescence KB, KG, and KR having exited out of the dichroic prism 43 is parallelized by the angle conversion element 56 and the collimator lens 57 and then outputted from the light source apparatus 12. The combined light KW (illumination light WL) outputted from the light source apparatus 12 travels toward the optical integration system 31, as shown in FIG. 1.

In the light source apparatus 12 according to the present embodiment, the first wavelength conversion rod 51, the second wavelength conversion rod 52, and the third wavelength conversion rod 53 are disposed in parallel to one another. Further, the light sources 37, which output excitation light, are provided in the positions where the light sources 37 face side surfaces of the wavelength conversion rods 51, 52, and 53. According to the present embodiment, a compact light source apparatus 12 capable of outputting white light can be achieved by the configuration described above.

Since the three wavelength conversion rods 51, 52, and 53 are disposed in parallel to one another, the plurality of LEDs 61, 62, and 63 can be arranged in an array, and all the LEDs 61, 62, and 63 on one side can be mounted on the corresponding single substrate 373. As a result, not only can the sizes of the LEDs 61, 62, and 63 and the substrates 373 be reduced, but wires for separately supplying the LEDs 61, 62, and 63 with drive current only need to be separately formed on each of the substrates. Further, the size of the entire light source apparatus 12 can be reduced because the space where the wires connected to the LEDs 61, 62, and 63 are separately routed can be reduced, the LED drivers 71, 72, and 73 can be collectively disposed, a mechanism for cooling the light sources 37 can be simplified, and other reasons.

Since the light source driver 58 is connect to the LEDs 61, 62, and 63 via short wires, the wiring resistance can be reduced. A blunt signal waveform in high-speed signal switching, such as pulse width modulation, can be suppressed. As a result, the quality of an image displayed by the projector 11 including the light source apparatus 12 can be increased.

Further, in the present embodiment, the light source apparatus 12 can be configured only by providing one type of LED that outputs ultraviolet light or two types of LED that output ultraviolet light and blue light. Drive circuits having similar specifications can therefore be used as the LED drivers 71, 72, and 73. As a result, cost necessary for the LED drivers 71, 72, and 73 can be reduced.

The light outputted from an LED typically has a diffusion angle greater than that of the light outputted from a semiconductor laser. A light source using an LED therefore tends to have etendue, which is determined by the product of the light emission area of the light source and the solid angle of the light from the light source, greater than the etendue of a light source using a semiconductor laser. An increase in the etendue of a light source apparatus increases the amount of light that an optical system on the downstream of the light source apparatus cannot capture, resulting in a decrease in the light use efficiency in a projector. It is therefore desirable that a light source apparatus for a projector has smallest possible etendue.

From this point of view, in the light source apparatus 12 according to the present embodiment, the light emitted from any of the LEDs 61, 62, and 63 and having a large diffusion angle enters the corresponding one of the wavelength conversion rods 51, 52, and 53 via side surfaces thereof, which each have a large area. On the other hand, the fluorescence KB, KG, and KR exits via the light exiting end surface 43c of the dichroic prism 43, and the light exiting end surface 43c has a size corresponding to the end surfaces of the wavelength conversion rods 51, 52, and 53, which are the surfaces each having an area sufficiently smaller than the area of each of the side surfaces of the wavelength conversion rods 51, 52, and 53. Therefore, according to the present embodiment, the light emission area can be substantially reduced, whereby a light source apparatus 12 having small etendue can be achieved. As a result, use of the light source apparatus 12 in the project 11 allows an increase in the light use efficiency in an optical system on the downstream of the light source apparatus 12.

In the present embodiment, the blue first fluorescence KB, the green second fluorescence KG, and the red third fluorescence KR are switched from one to another at high speed to produce the white combined light KW. Adjusting the balance among the amounts of fluorescence KB, KG, and KB can therefore adjust the white balance of the combined light KW.

As a specific white balance adjustment method, when the LEDs 61, 62, and 63 are each driven in pulse width modulation, the pulse width of the drive signal supplied to each of the LEDs 61, 62, and 63 may be adjusted to adjust the white balance. Instead, drive current or drive voltage supplied to each of the LEDs 61, 62, and 63 may be adjusted to adjust the white balance. Still instead, the period for which each of the LEDs 61, 62, and 63 emits light in one frame (duty) may be adjusted to adjust the white balance.

As a white balance adjustment method in the design stage of the light source apparatus, the length and width of each of the wavelength conversion rods 51, 52, and 53 may be adjusted to adjust the white balance. Instead, the density of the phosphor material or light emitting atom in each of the wavelength conversion rods 51, 52, and 53 may be adjusted to adjust the white balance.

In the light source apparatus 12 according to the present embodiment, the angle conversion element 56, which is provided on the light exiting side of the light combiner 38, can parallelize the combined light KW having exited out of the light combiner 38. Further, the collimator lens 57, which is provided on the light exiting side of the angle conversion element 56, can further increase the parallelism of the combined light KW. The light use efficiency in an optical system on the downstream of the light source apparatus 12 can thus be increased.

In the light source apparatus 12 according to the present embodiment, the mirror 65, which is provided on the second end surface 51b of the first wavelength conversion rod 51, the fourth end surface 52b of the second wavelength conversion rod 52, and the sixth end surface 53b of the third wavelength conversion rod 53, prevents the fluorescence KB, KG, and KR from exiting via the second end surface 51b, the fourth end surface 52b, or the sixth end surface 53b. The efficiency at which the fluorescence KB, KG, and KR is used can thus be increased.

A reflection film formed, for example, of a metal film may be provided in place of the gap (air layer) between the side surface 51c1 of the first wavelength conversion rod 51 and the side surface 52c1 of the second wavelength conversion rod 52 and between the side surface 52c2 of the second wavelength conversion rod 52 and the side surface 53c1 of the third wavelength conversion rod 53. It is, however, noted that optical loss is smaller at these reflection surfaces when the air layer is provided between two of the wavelength conversion rods 51, 52, and 53 than in the case where the reflection film is provided therebetween. Therefore, when priority is placed on the suppression of optical loss, it is preferable to provide the air layer between two of the wavelength conversion rods.

That is, since the side surfaces of two of the wavelength conversion rods 51, 52, and 53 face each other via the air layer, light reflection at the side surfaces of the wavelength conversion rods 51, 52, and 53 is total reflection accompanied by no optical loss. The light use efficiency can therefore be increased. Further, the side surfaces of the wavelength conversion rods 51, 52, and 53 are each desirably so polished into a smooth surface that irregularities are minimized. The optical loss can thus be further suppressed.

The projector 11 according to the present embodiment, which includes the light source apparatus 12 described above, is reduced in size and excels in the light use efficiency and image quality.

The wavelength conversion rods 51, 52, and 53 in the present embodiment may have the configurations shown in the following variations. In the description of a light source apparatus according to each of the following variations, the light source apparatus will not be shown because the light source apparatus according to the variation differs from the light source apparatus according to the embodiment described above only in terms of the phosphors contained in the wavelength conversion rods.

First Variation

In a light source apparatus according to a first variation, a first wavelength conversion rod converts first excitation light into first fluorescence having a blue wavelength band (first wavelength band). A second wavelength conversion rod converts second excitation light into second fluorescence having a yellow wavelength band (second wavelength band). A third wavelength conversion rod converts third excitation light into third fluorescence having the yellow wavelength band (third wavelength band). That is, in the first variation, the first wavelength band is a blue wavelength band, the second wavelength band is a yellow wavelength band, and the third wavelength band is the yellow wavelength band. The second wavelength band and the third wavelength band may be the same-color wavelength band as described above.

The other configurations of the light source apparatus according to the first variation are the same as those of the light source apparatus according to the first embodiment.

The second and third wavelength conversion rods are each formed of a ceramic phosphor (polycrystal phosphor) that converts in terms of wavelength excitation light into fluorescence having a yellow wavelength band. The yellow wavelength band ranges, for example, from 490 to 750 nm. In place of a polycrystal phosphor, a single-crystal phosphor, fluorescent glass, or a binder which is made of glass, resin, or any other material and in which phosphor particles are dispersed may be used.

Specifically, for example, an yttrium-aluminum-garnet-based (YAG-based) phosphor is used as the phosphor that emits fluorescence having the yellow wavelength band. Consider YAG:Ce, which contains cerium (Ce) as an activator, by way of example, and the yellow phosphor can be made, for example, of a material produced by mixing raw powder materials containing $Y_2O_3$, $Al_2O_3$, $CeO_3$, and other constituent elements with one another and causing the mixture to undergo a solid-phase reaction, Y—Al—O amorphous particles produced by using a coprecipitation method, a sol-gel method, or any other wet method, or YAG particles produced by using a spray-drying method, a flame-based thermal decomposition method, a thermal plasma method, or any other gas-phase method.

In the first variation, out of the second fluorescence having exited from the second wavelength conversion rod and having the yellow wavelength band, components corresponding to the green wavelength band pass through the two dichroic mirrors of the dichroic prism and exit out of the dichroic prism. Out of the third fluorescence having exited from the third wavelength conversion rod and having the yellow wavelength band, components corresponding to the red wavelength band is reflected off one of the dichroic mirrors and exit out of the dichroic prism. Therefore, in the present variation, in which the wavelength bands (colors) of the second and third fluorescence differ from those in the first embodiment, the blue light, the green light, and the red light sequentially exit in a time division manner, as in the first embodiment.

The first variation also provides the same effects as those provided by the first embodiment, for example, a compact light source apparatus that outputs white light can be achieved.

Effects specific to the first variation are as follows.

In the case of currently commercially available phosphor materials, the conversion efficiency of a yellow phosphor that emits yellow light is sufficiently higher than the conversion efficiency of a red phosphor that emits red light. Therefore, even when the dichroic prism separates only the green light components or the red light components from the yellow light, a light source apparatus having higher efficiency than in a case where a red phosphor is used can be achieved.

Further, since two types of phosphor, a blue phosphor and a yellow phosphor, only need to be provided, the cost of the light source apparatus according to the first variation can be reduced as compared with the embodiment described above, in which three types of phosphor, a blue phosphor, a green phosphor, and a red phosphor need to be provided.

Second Variation

In a light source apparatus according to a second variation, a first wavelength conversion rod converts first excitation light into first fluorescence having a blue wavelength band (first wavelength band). A second wavelength conversion rod converts second excitation light into second fluorescence having a green wavelength band (second wavelength band). A third wavelength conversion rod converts third excitation light into third fluorescence having a yellow wavelength band (third wavelength band). That is, in the first variation, the first wavelength band is a blue wavelength band, the second wavelength band is a green wavelength band, and the third wavelength band is a yellow wavelength band.

The other configurations of the light source apparatus according to the second variation are the same as those of the light source apparatus according to the first embodiment.

The second variation also provides the same effects as those provided by the first embodiment, for example, a compact light source apparatus that outputs white light can be achieved. Further, as the phosphor contained in the third wavelength conversion rod, a yellow phosphor is used in place of a red phosphor, whereby the second variation provides the same effects as those provided by the first variation, for example, a high-efficiency light source apparatus can be achieved.

Second Embodiment

A second embodiment of the present disclosure will be described below with reference to FIG. 5.

In the first embodiment, the projector including a micromirror-type light modulator has been presented by way of example, and the second embodiment will be described by presenting a liquid crystal projector including a liquid crystal panel by way of example.

FIG. 5 is a schematic configuration diagram of a projector according to the second embodiment.

A projector 16 includes the light source apparatus 12, the optical integration system 31, a polarization conversion element 32, the superimposing system 33, the field lens 10, a reflective polarizer 17, a light modulator 18, and the projection optical system 15, as shown in FIG. 5.

As the light source apparatus according to the second embodiment, the light source apparatus 12 according to the first embodiment is used. The light source apparatus 12 will therefore not be described in the following sections.

The optical integration system 31 includes the first lens array 31a and the second lens array 31b. The optical integration system 31 and the superimposing system 33 form a uniform illumination system and homogenize the intensity distribution of the illumination light outputted from the light source apparatus 12 on the light modulator 18. The polarization conversion element 32 converts the illumination light having exited out of the optical integration system 31 into P-polarized light with respect to the reflective polarizer 17.

The light modulator 18 is formed of a reflective liquid crystal panel. When a reflective liquid crystal panel is used as the light modulator 18, the response speed of the liquid crystal material increases, whereby moving image display performance can be increased when the light modulator 18 is driven in a time sequential manner.

The reflective polarizer 17 is so disposed in the optical axis of the light source apparatus 12 between the field lens 10 and the light modulator 18 as to incline by 45° with respect to the optical axis. The reflective polarizer 17 transmits P-polarized light with respect to the reflective polarizer 17 and reflects S-polarized light with respect thereto. The illumination light having exited out of the field lens 10 passes through the reflective polarizer 17 and is guided to the light modulator 18, and the image light modulated by the light modulator 18 is guided to the projection optical apparatus 15.

The projector 16 according to the present embodiment, which includes the light source apparatus 12 according to the first embodiment, is reduced in size and excels in the light use efficiency and image quality.

The technical range of the present disclosure is not limited to the embodiments described above, and a variety of changes can be made thereto to the extent that the changes do not depart from the substance of the present disclosure.

For example, in the first embodiment, the fluorescence exiting end surface of each of the wavelength conversion rods may be provided with a dichroic mirror that reflects the excitation light that enters the wavelength conversion rod and transmits the fluorescence generated in the wavelength conversion rod. According to the configuration described above, the amount of excitation light that is not used to excite the phosphor but exits out of each of the wavelength conversion rods can be reduced, and the wavelength conversion efficiency of the wavelength conversion rod can be increased. Moreover, a dichroic mirror that transmits the excitation light and reflects the fluorescence may be provided on each side surface of each of the wavelength conversion rods.

The embodiments presented and described above use a dichroic prism as the light combiner, and another optical member capable of light combination can instead be used. For example, a scatterer having an internal light scattering structure can also be used as the light combiner. Examples of the scatterer may include glass containing scattering particles and an optical member including an anisotropic scattering layer. In the case where the scatterer has scattering anisotropy, the anisotropy of the scatterer desirably causes incident light to be scattered in the direction perpendicular to the light exiting end surface more strongly than in the direction parallel thereto.

The shape, the number, the arrangement, the material, and other specific configurations of the components that form the light source apparatus are not limited to those in the embodiments described above and can be changed as appropriate.

The above embodiments of the present disclosure each have been described with reference to the case where the light source apparatus according to the embodiment is incorporated in a projector, but not necessarily. The light source apparatus according to each of the embodiments of the present disclosure may also be used as a lighting apparatus, a headlight of an automobile, and other components.

What is claimed is:

1. A light source apparatus comprising:
a light source including a first light emitting device that outputs first excitation light, a second light emitting device that outputs second excitation light, and a third light emitting device that outputs third excitation light;
a first wavelength converter that converts the first excitation light into first fluorescence having a first wavelength band different from a wavelength band of the first excitation light;
a second wavelength converter that converts the second excitation light into second fluorescence having a second wavelength band different from a wavelength band of the second excitation light and the first wavelength band;
a third wavelength converter that converts the third excitation light into third fluorescence having a third wavelength band different from a wavelength band of the third excitation light and the first wavelength band;
a light combiner that combines the first fluorescence, the second fluorescence, and the third fluorescence with one another and outputs combined light, and
a light source driver that causes the first light emitting device to output the first excitation light, the second light emitting device to output the second excitation light, and the third light emitting device to output the third excitation light in a time sequential manner,
wherein the first wavelength converter has a first end surface and a second end surface that face each other and a first side surface that intersects the first and second end surfaces,
the second wavelength converter has a third end surface and a fourth end surface that face each other and a second side surface that intersects the third and fourth end surfaces,
the third wavelength converter has a fifth end surface and a sixth end surface that face each other and a third side surface that intersects the fifth and sixth end surfaces,
the first, second, and third wavelength converters are disposed in parallel to one another,
the first excitation light enters the first wavelength converter via the first side surface, the second excitation light enters the second wavelength converter via the second side surface, and the third excitation light enters the third wavelength converter via the third side surface, and
the first fluorescence exits via the first end surface toward the light combiner, the second fluorescence exits via the third end surface toward the light combiner, and the third fluorescence exits via the fifth end surface toward the light combiner.

2. The light source apparatus according to claim 1, wherein the first wavelength band is a blue wavelength band, the second wavelength band is a green wavelength band, and the third wavelength band is a red wavelength band.

3. The light source apparatus according to claim 1, wherein the first wavelength band is a blue wavelength band, the second wavelength band is a yellow wavelength band, and the third wavelength band is the yellow wavelength band.

4. The light source apparatus according to claim 1, wherein the first wavelength band is a blue wavelength band, the second wavelength band is a green wavelength band, and the third wavelength band is a yellow wavelength band.

5. The light source apparatus according to claim 1, wherein the first, second, and third light emitting devices are provided at a substrate that faces the first, second, and third side surfaces.

6. A projector comprising:
the light source apparatus according to claim 1;
a light modulator that modulates light from the light source apparatus in accordance with image information; and
a projection optical apparatus that projects the light modulated by the light modulator.

7. A projector as in claim 6, wherein the light modulator comprises one of a micromirror-type light modulator and a reflective liquid crystal panel.

8. A light source apparatus as in claim 1, wherein the first excitation light directly enters the first wavelength converter via the first side surface, the second excitation light directly enters the second wavelength converter via the second side surface, and the third excitation light directly enters the third wavelength converter via the third side surface.

9. A light source apparatus as in claim 1, wherein the end surfaces for each respective wavelength converter have areas that are smaller than the areas of the side surfaces for each respective wavelength converter.

10. A light source apparatus as in claim 1, wherein a period of time that each light emitting device outputs its respective excitation light is adjusted to adjust a white balance of the combined light from the light combiner.

11. A light source apparatus as in claim 1, wherein a period of time that the first light emitting device outputs the first excitation light, a period of time that the second light emitting device outputs the second excitation light, and a period of time that the third light emitting device outputs the third excitation light are different from one another.

12. A light source apparatus comprising:
a light source that outputs first excitation light, second excitation light, and third excitation light;
a first wavelength converter that converts the first excitation light into first fluorescence having a first wavelength band different from a wavelength band of the first excitation light;
a second wavelength converter that converts the second excitation light into second fluorescence having a second wavelength band different from a wavelength band of the second excitation light and the first wavelength band;
a third wavelength converter that converts the third excitation light into third fluorescence having a third wavelength band different from a wavelength band of the third excitation light and the first wavelength band;

a light combiner that combines the first fluorescence, the second fluorescence, and the third fluorescence with one another and outputs combined light; and
a light source driver that causes the light source to output the first excitation light, the second excitation light, and the third excitation light in a time sequential manner,
wherein the first wavelength converter has a first end surface and a second end surface that face each other and a first side surface that intersects the first and second end surfaces,
the second wavelength converter has a third end surface and a fourth end surface that face each other and a second side surface that intersects the third and fourth end surfaces,
the third wavelength converter has a fifth end surface and a sixth end surface that face each other and a third side surface that intersects the fifth and sixth end surfaces,
the first, second, and third wavelength converters are disposed in parallel to one another, the light source includes a first light emitting device that emits the first excitation light, a second light emitting device that emits the second excitation light, and a third light emitting device that emits the third excitation light,
the first excitation light directly enters the first wavelength converter via the first side surface, the second excitation light directly enters the second wavelength converter via the second side surface, and the third excitation light directly enters the third wavelength converter via the third side surface, and
the first fluorescence exits via the first end surface toward the light combiner, the second fluorescence exits via the third end surface toward the light combiner, and the third fluorescence exits via the fifth end surface toward the light combiner.

13. The light source apparatus according to claim 12, wherein the first wavelength band is a blue wavelength band, the second wavelength band is a green wavelength band, and the third wavelength band is a red wavelength band.

14. The light source apparatus according to claim 12, wherein the first wavelength band is a blue wavelength band, the second wavelength band is a yellow wavelength band, and the third wavelength band is the yellow wavelength band.

15. The light source apparatus according to claim 12, wherein the first wavelength band is a blue wavelength band, the second wavelength band is a green wavelength band, and the third wavelength band is a yellow wavelength band.

16. A projector comprising:
the light source apparatus according to claim 12;
a light modulator that modulates light from the light source apparatus in accordance with image information; and
a projection optical apparatus that projects the light modulated by the light modulator.

17. A projector as in claim 16, wherein the light modulator comprises one of a micromirror-type light modulator and a reflective liquid crystal panel.

18. A light source apparatus as in claim 12, wherein the end surfaces for each respective wavelength converter have areas that are smaller than the areas of the side surfaces for each respective wavelength converter.

19. A light source apparatus as in claim 12, wherein a period of time that each light emitting device outputs its respective excitation light is adjusted to adjust a white balance of the combined light from the light combiner.

20. A light source apparatus as in claim 12, wherein
a period of time that the first light emitting device outputs the first excitation light, a period of time that the second light emitting device outputs the second excitation light, and a period of time that the third light emitting device outputs the third excitation light are different from one another.

* * * * *